US012363822B2

(12) United States Patent
Bi et al.

(10) Patent No.: US 12,363,822 B2
(45) Date of Patent: Jul. 15, 2025

(54) FLEXIBLE PRINTED CIRCUIT AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xianlei Bi, Beijing (CN); Xun Yao, Beijing (CN); Jianjun Wu, Beijing (CN); Chuanyan Lan, Beijing (CN); Qian Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 281 days.

(21) Appl. No.: 17/926,719

(22) PCT Filed: Nov. 8, 2021

(86) PCT No.: PCT/CN2021/129373
§ 371 (c)(1),
(2) Date: Nov. 21, 2022

(87) PCT Pub. No.: WO2022/134896
PCT Pub. Date: Jun. 30, 2022

(65) Prior Publication Data
US 2023/0209704 A1 Jun. 29, 2023

(30) Foreign Application Priority Data
Dec. 25, 2020 (CN) .......................... 202011567078.3

(51) Int. Cl.
*H05K 1/02* (2006.01)
*H05K 3/28* (2006.01)

(52) U.S. Cl.
CPC ............... *H05K 1/028* (2013.01); *H05K 3/28* (2013.01); *H05K 2201/10128* (2013.01)

(58) Field of Classification Search
CPC ...... H05K 1/02; H05K 1/0201; H05K 1/0204; H05K 1/0225; H05K 1/028; H05K 1/0298;
(Continued)

(56) References Cited

U.S. PATENT DOCUMENTS

| 4,812,213 | A | * | 3/1989 | Barton | ................... | H05K 3/427 |
|---|---|---|---|---|---|---|
| | | | | | | 430/318 |
| 4,945,029 | A | * | 7/1990 | Bronnenberg | ....... | H05K 3/4691 |
| | | | | | | 430/318 |

(Continued)

FOREIGN PATENT DOCUMENTS

| CN | 111933611 A | 11/2020 |
|---|---|---|
| CN | 112566363 A | 3/2021 |

(Continued)

*Primary Examiner* — Tuan T Dinh
(74) *Attorney, Agent, or Firm* — XSENSUS LLP

(57) ABSTRACT

A flexible printed circuit includes a substrate, a first conductive layer, and a first protective layer. The substrate has a body region, a first bonding region, and a connection region located between the body region and the first bonding region. The first conductive layer is located on a first side of the substrate, and extends from the body region to the first bonding region via the connection region. The first protective layer is located on a side of the first conductive layer away from the substrate, and extends from the body region to the connection region. The first protective layer partially covers the connection region.

18 Claims, 6 Drawing Sheets

(58) Field of Classification Search
CPC ...... H05K 1/0346; H05K 1/118; H05K 1/142;
H05K 1/162; H05K 1/183; H05K 1/189;
H05K 3/0097; H05K 3/36; H05K 3/281;
H05K 3/361; H05K 3/363; H05K 3/427;
H05K 3/4038; H05K 3/4691; C08G
73/106; C08G 73/1042; C08G 73/1053;
C08G 73/1071; C08G 73/1075
USPC ........ 361/749, 795; 174/251, 252, 254, 256,
174/264; 428/458, 473.5
See application file for complete search history.

(56) References Cited

U.S. PATENT DOCUMENTS

| | | | | |
|---|---|---|---|---|
| 8,358,110 | B2* | 1/2013 | Rouvala | H01G 11/36 |
| | | | | 320/166 |
| 9,832,888 | B1* | 11/2017 | Li | H05K 1/0298 |
| 2005/0122700 | A1* | 6/2005 | Kim | H05K 3/361 |
| | | | | 361/795 |
| 2005/0248709 | A1* | 11/2005 | Kang | G02F 1/13452 |
| | | | | 349/150 |
| 2005/0257952 | A1* | 11/2005 | Morimoto | H05K 3/4038 |
| | | | | 174/256 |
| 2012/0175154 | A1* | 7/2012 | Matsuda | H05K 3/36 |
| | | | | 156/182 |
| 2014/0190727 | A1* | 7/2014 | Lee | H05K 1/0204 |
| | | | | 174/254 |
| 2014/0190729 | A1* | 7/2014 | Briggs | H05K 1/028 |
| | | | | 156/60 |
| 2014/0268594 | A1* | 9/2014 | Wang | H05K 1/183 |
| | | | | 29/841 |
| 2015/0027754 | A1* | 1/2015 | Shimoda | C08G 73/1053 |
| | | | | 524/588 |
| 2018/0039357 | A1* | 2/2018 | Baek | G06F 3/0443 |
| 2019/0310302 | A1* | 10/2019 | Lee | G06F 3/04164 |
| 2023/0207542 | A1* | 6/2023 | Zhang | H01L 23/5386 |
| | | | | 257/91 |

FOREIGN PATENT DOCUMENTS

CN 214315726 U 9/2021
JP 2020-74437 A 5/2020

* cited by examiner

FLEXIBLE PRINTED CIRCUIT AND DISPLAY DEVICE

CROSS-REFERENCE TO RELATED APPLICATIONS

This application is a national phase entry under 35 USC 371 of International Patent Application No. PCT/CN 2021/129373 filed on Nov. 8, 2021, which claims the priority of the Chinese Patent Application No. 202011567078.3 filed on Dec. 25, 2020, which are incorporated herein by reference in their entirety.

TECHNICAL FIELD

The present disclosure relates to the field of display technologies, and in particular, to a flexible printed circuit and a display device.

BACKGROUND

A flexible printed circuit (FPC) is a printed circuit board with high reliability and excellent flexibility, which is made of a polyimide or polyester film as a substrate. Flexible printed circuits are widely applied to mobile phones, notebook computers, digital cameras and other products due to characteristics of high wiring density, light weight, small thickness and good bending performance.

SUMMARY

In an aspect, a flexible printed circuit is provided. The flexible printed circuit includes a substrate, a first conductive layer and a first protective layer. The substrate has a body region, a first bonding region, and a connection region located between the body region and the first bonding region. The first conductive layer is located on a first side of the substrate, and extends from the body region to the first bonding region via the connection region. The first protective layer is located on a side of the first conductive layer away from the substrate, and extends from the body region to the connection region. The first protective layer partially covers the connection region.

In some embodiments, the connection region includes a first region and a second region connected to each other, and the first region is closer to the body region than the second region. The first region is further connected to the body region, and the second region is further connected to the first bonding region. The first protective layer covers the first region, and does not cover the second region.

In some embodiments, a distance from any position on a dividing line between the first region and the second region to the body region is less than a distance from this position to the first bonding region.

In some embodiments, the distance from any position on the dividing line between the first region and the second region to the body region is greater than or equal to 0.5 mm.

In some embodiments, an area of a region in the connection region covered by the first protective layer is less than an area of a region in the connection region uncovered by the first protective layer.

In some embodiments, the flexible printed circuit further includes a second protective layer located on the side of the first conductive layer away from the substrate. The second protective layer covers at least a region in the connection region uncovered by the first protective layer.

In some embodiments, the second protective layer further partially covers the first protective layer.

In some embodiments, a portion, overlapped with an orthographic projection of the first protective layer on the substrate, of an orthographic projection of the second protective layer on the substrate is a first overlapping portion, and the first overlapping portion is located at the connection region. A distance between an end of the first overlapping portion proximate to the body region and an end of the first overlapping portion away from the body region is greater than or equal to 0.2 mm.

In some embodiments, a portion of the first conductive layer located at the first bonding region includes a plurality of conductive blocks. The flexible printed circuit further includes a third protective layer including a plurality of conductive protective films. A conductive protective film in the plurality of conductive protective films covers a conductive block in the plurality of conductive blocks. The second protective layer further covers a partial region of the first bonding region and a partial region of any conductive protective film.

In some embodiments, a portion, overlapped with an orthographic projection of the any conductive protective film on the substrate, of an orthographic projection of the second protective layer on the substrate is a second overlapping portion, and the second overlapping portion is located at the first bonding region. A distance between an end of the second overlapping portion proximate to the connection region and an end of the second overlapping portion away from the connection region is greater than or equal to 0.2 mm.

In some embodiments, the second protective layer includes a green oil protective layer.

In some embodiments, a thickness of the second protective layer is less than a thickness of the first protective layer.

In some embodiments, the flexible printed circuit further includes a second conductive layer and a fourth protective layer. The second conductive layer is located on a second side of the substrate, and the second side is a side of the substrate that is opposite to the first side. The second conductive layer covers the body region. The fourth protective layer is located on a side of the second conductive layer away from the substrate, and extends from the body region to the first bonding region via the connection region. At least one first opening is disposed in the fourth protective layer, and an orthogonal projection of the at least one first opening on the substrate is located in the connection region.

In some embodiments, the fourth protective layer includes a first portion, a second portion and at least two rib-shaped structures. The first portion covers at least the body region. The second portion covers at least the first bonding region. Orthographic projections of the at least two rib-shaped structures on the substrate are located in the connection region. Two opposite ends of each rib-shaped structure are respectively connected to the first portion and the second portion. Any two adjacent rib-shaped structures, the first portion and the second portion enclose to form a first opening in the at least one first opening.

In some embodiments, the at least two rib-shaped structures include two rib-shaped structures respectively extending along two opposite sides of the connection region.

In some embodiments, a width of each rib-shaped structure is in a range of 0.2 mm to 1 mm, inclusive.

In some embodiments, a distance from any point on a border, proximate to the first bonding region, of an orthographic projection of the first protective layer on the substrate to the orthogonal projection of the first opening on the substrate is greater than or equal to 0.5 mm.

In some embodiments, the first protective layer includes a first insulating layer and a first adhesive layer, and the first adhesive layer is closer to the first conductive layer than the first insulating layer; and/or the fourth protective layer includes a second insulating layer and a second adhesive layer, and the second adhesive layer is closer to the second conductive layer than the second insulating layer.

In some embodiments, the flexible printed circuit further includes an integrated chip and a reinforcement layer. The integrated chip is located on a side of the fourth protective layer away from the substrate. An orthographic projection of the integrated chip on the substrate is located in the body region. The integrated chip passes through the fourth protective layer to be electrically connected to the second conductive layer. The reinforcement layer is located on a side of the first protective layer away from the substrate. An orthographic projection of the reinforcement layer on the substrate is overlapped with or partially overlapped with the orthographic projection of the integrated chip on the substrate.

In another aspect, a display device is provided. The display device includes a display panel and the flexible printed circuit in any one of the above embodiments. The first bonding region in the flexible printed circuit is bonded to the display panel.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
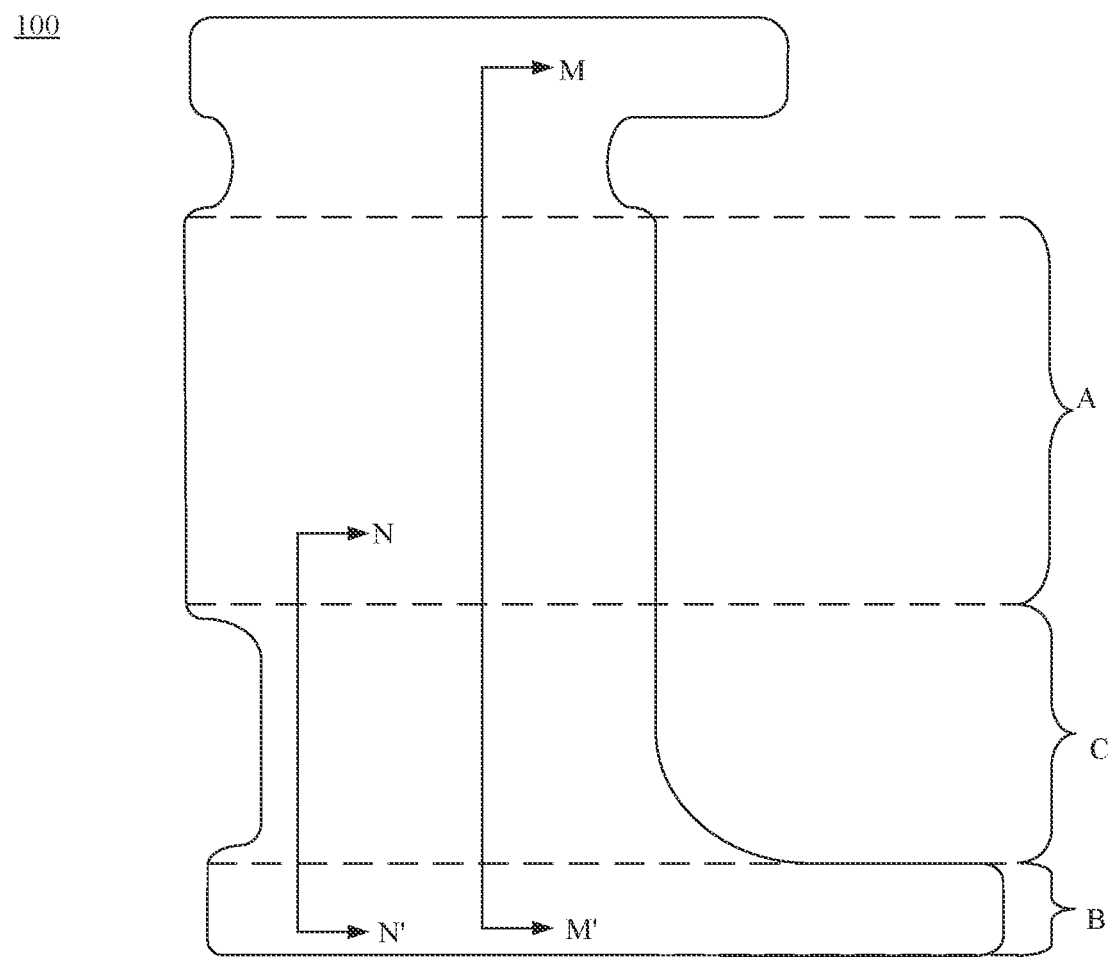
FIG. 1 is a structural diagram of a flexible printed circuit, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "coupled" and "connected" and extensions thereof may be used. For example, the term "connected" may be used in the description of some embodiments to indicate that two or more components are in direct physical or electrical contact with each other. The embodiments disclosed herein are not necessarily limited to the contents herein.

The phrase "A and/or B" includes following three combinations: only A, only B, and a combination of A and B.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In the related art, a display device mainly includes a display panel, a flexible printed circuit and a control circuit board. A first bonding end of the flexible printed circuit is bonded to the display panel. By bending a portion of the flexible printed circuit close to the first bonding end, the rest portion of the flexible printed circuit may be bent to a back of the display panel, so that a second bonding end of the flexible printed circuit may be bonded to the control circuit board located on the back of the display panel. However, it is found through research that the portion of the flexible printed circuit bent to the back of the display panel in the related art tends to bounce and warp. Moreover, the bent portion of the flexible printed circuit is easy to tear.

Figure 2A:
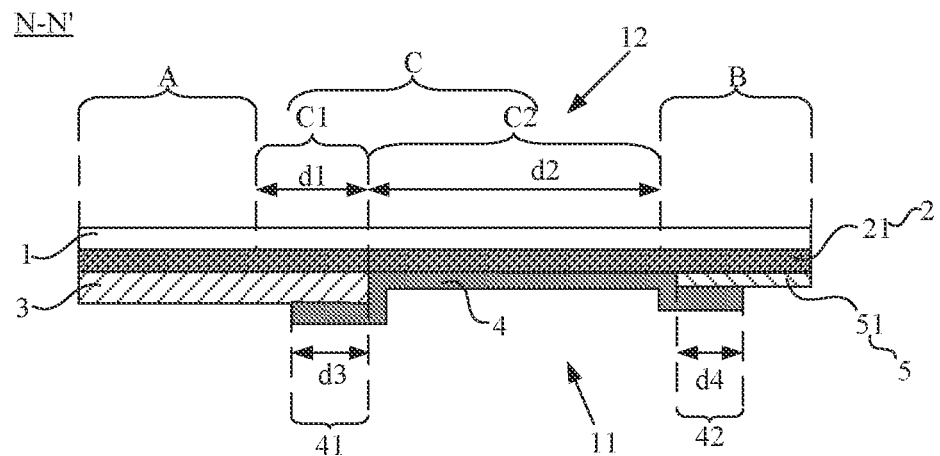
FIG. 2A is a sectional view of the flexible printed circuit at N-N' in FIG. 1, in accordance with some embodiments.

Based on this, some embodiments of the present disclosure provide a flexible printed circuit 100. Referring to FIGS. 1 and 2A, the flexible printed circuit 100 includes a substrate 1, a first conductive layer 2 and a first protective layer 3. The substrate 1 has a body region A, a first bonding region B, and a connection region C located between the body region A and the first bonding region B. It will be noted that the body region A includes a component mounting region, and the component mounting region is a region of the substrate 1 for mounting a chip and other devices. On this basis, for example, a distance between a dividing position between the body region A and the connection region C and the component mounting region is greater than a preset distance (e.g., 0.8 mm). In this way, when a bending occurs at the connection region C, the component mounting region is not easily affected by a bending stress, which is conducive to improving connection reliability of the chip and other devices.

The first conductive layer 2 is located on a first side 11 of the substrate 1, and extends from the body region A to the first bonding region B via the connection region C.

The first protective layer 3 is located on a side of the first conductive layer 2 away from the substrate 1. The first protective layer 3 extends from the body region A to the connection region C, and partially covers the connection region C.

The substrate 1 may be made of polyimide (PI). The first conductive layer 2 may be made of copper. A material of the first protective layer 3 may include an insulating material.

In addition, the flexible printed circuit 100 may be a main flexible printed circuit (MFPC) for driving a display panel to realize a display function, or a touch flexible printed circuit (TFPC) for driving a display panel to realize a touch function, which is not limited.

For the flexible printed circuit 100 provided in some embodiments of the present disclosure, the flexible printed circuit 100 has fewer film layers and a smaller thickness at a position corresponding to the connection region C and uncovered by the first protective layer 3, so that the flexible printed circuit 100 has good flexibility at the position corresponding to the connection region C. Therefore, when the first bonding region B in the flexible printed circuit 100 is bonded to a display panel, the flexible printed circuit 100 may be bent at the position corresponding to the connection region C (referring to FIG. 2B), so that a portion of the flexible printed circuit 100 located on a side of the connection region C away from the first bonding region B is easily bent to a back of the display panel. Moreover, when the flexible printed circuit 100 is bent to the back of the display panel, a bounce force F in a direction perpendicular to the substrate 1 to which the flexible printed circuit 100 is subjected at the body region A may be reduced, which is conducive to avoiding bouncing and warping of the flexible printed circuit 100 after being bent.

In addition, since the flexible printed circuit 100 has good flexibility, in a display device having the flexible printed circuit 100, the flexible printed circuit may be bent more to a back of a display panel of the display device, so that a space occupied by the flexible printed circuit around the display panel is reduced, and thus, a bezel of the display device may be arranged to be narrow.

Moreover, since the first protective layer 3 may partially cover the connection region C, the use of the material of the first protective layer 3 may be reduced, so that the manufacturing cost of the flexible printed circuit 100 is reduced.

The first protective layer 3 partially covers the connection region C, which may be that, in some embodiments, at least one opening is provided in a portion of the first protective layer 3 covering the connection region C, so as to partially expose the first conductive layer 2.

Alternatively, in some other embodiments, as shown in FIG. 2A, the connection region C may include a first region C1 and a second region C2 connected to each other. The first region C1 is closer to the body region A than the second region C2. The first region C1 is further connected to the body region A, and the second region C2 is further connected to the first bonding region B. The first protective layer 3 covers the first region C1, and does not cover the second region C2.

In this way, the first protective layer 3 covers the first region C1 close to the body region A, and does not cover the second region C2, so that the flexible printed circuit 100 has fewer film layers at the second region C2. Thus, by bending the flexible printed circuit 100 at a position corresponding to the second region C2, a portion of the flexible printed circuit 100 located on a side of the second region C2 away from the first bonding region B may be easily bent to the back of the display panel, thereby effectively improving the bending performance of the flexible printed circuit 100.

For example, as shown in FIG. 2A, a distance d1 from any position on a dividing line D between the first region C1 and the second region C2 to the body region A is less than a distance d2 from this position to the first bonding region B. In this way, an area of the first region C1 is less than an area of the second region C2. That is, an area of a region in the connection region C where bending is easily realized is greater than an area of a region in the connection region C where bending is not easily realized, thereby further improving the flexibility of the flexible printed circuit 100 at the position corresponding to the connection region C.

It will be noted that a shape of the dividing line D between the first region C1 and the second region C2 is not limited. For example, the shape of the dividing line D may be a straight line segment. For another example, the shape of the dividing line D may be a curve segment or a broken line segment.

In some embodiments, as shown in FIG. 2A, the distance d1 from any position on the dividing line D between the first region C1 and the second region C2 to the body region A is greater than or equal to 0.5 mm. In this case, the area of the first region C1 is small. That is, an area of a region in the connection region C covered by the first protective layer 3 is small, and an area of a region in the connection region C uncovered by the first protective layer 3 is large, so that the flexibility of the flexible printed circuit 100 at the position corresponding to the connection region C is improved.

In some embodiments, as shown in FIG. 2A, the area of the region in the connection region C covered by the first protective layer 3 is less than the area of the region in the connection region C uncovered by the first protective layer 3. A shape of the portion of the first protective layer 3 covering the connection region C is not limited. In this way, the area of the region in the connection region C uncovered by the first protective layer 3 is larner, and the area of the region in the connection region C where the flexible printed circuit 100 is easily bent is larger, so that the flexible printed circuit 100 has good flexibility at the position corresponding to the connection region C. Therefore, by bending the flexible printed circuit 100 at the position corresponding to the connection region C, the portion of the flexible printed circuit 100 located on the side of the connection region C away from the first bonding region B may be easily bent to the back of the display panel.

Figure 2B:
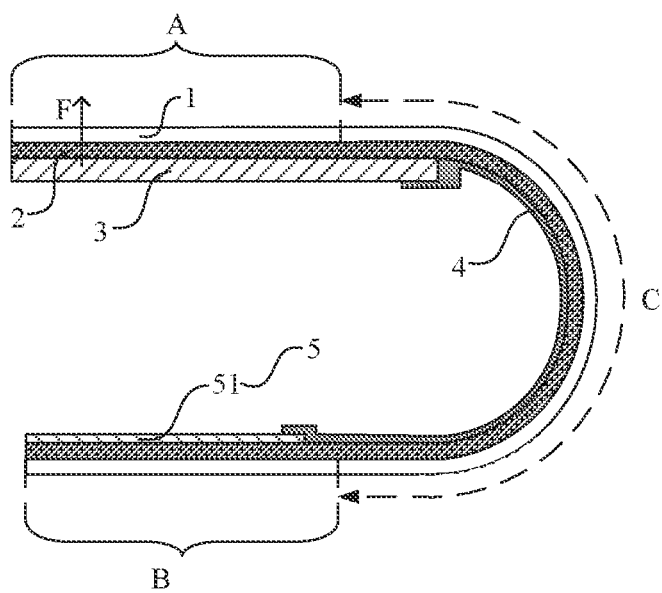
FIG. 2B is a structural diagram of a bent flexible printed circuit, in accordance with some embodiments.
Figure 3:
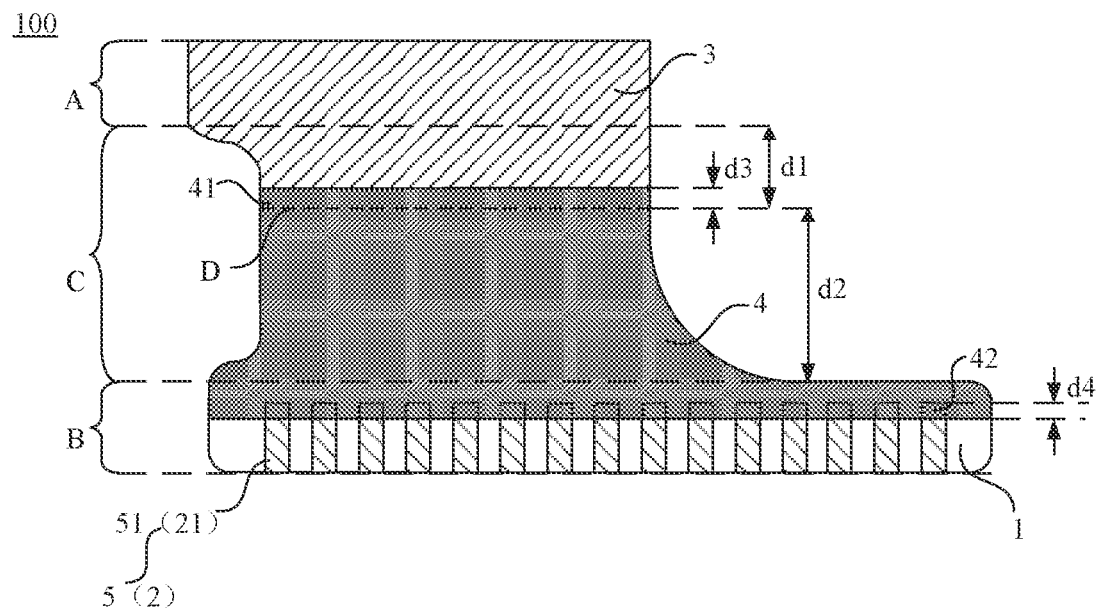
FIG. 3 is a partial bottom view of a flexible printed circuit, in accordance with some embodiments.

In some embodiments, as shown in FIGS. 2A, 2B and 3, the flexible printed circuit 100 further includes a second protective layer 4. The second protective layer 4 is located on the side of the first conductive layer 2 away from the substrate 1. The second protective layer 4 covers at least the region in the connection region C uncovered by the first protective layer 3 (that is, the second protective layer 4 covers at least a portion that is uncovered by the first protective layer 3 in a portion of the first conductive layer 2 corresponding to the connection region C). In this way, the second protective layer 4 is capable of effectively protecting the first conductive layer 2, so as to prevent the first conductive layer 2 from being exposed, which is conducive to avoiding a circuit failure of the flexible printed circuit due to a fact that wirings in the first conductive layer are damaged caused by corrosion of the first conductive layer.

In some embodiments, as shown in FIGS. 2A and 2B, the second protective layer 4 covers the region in the connection region C uncovered by the first protective layer 3, and further partially covers the first protective layer 3. That is, the second protective layer 4 covers a side of the first protective layer 3 proximate to the first bonding region B, and a portion, close to the first bonding region B, of a surface of the first protective layer 3 away from the substrate 1. In this way, an orthographic projection of the second protective layer 4 on the substrate 1 and an orthographic projection of the first protective layer 3 on the substrate 1 have no gap therebetween, so that the second protective layer 4 is capable of completely covering a portion of the first conductive layer 2 that is close to an edge of the first protective layer 3 proximate to the first bonding region B. Thus, an exposure of the portion of the first conductive layer that is close to the edge of the first protective layer proximate to the first bonding region B, which is caused by process errors of forming the second protective layer, is effectively avoided, so that the wirings in the first conductive layer 2 are further protected from being easily corroded, which is conducive to prolonging the service life of the flexible printed circuit 100.

In some embodiments, as shown in FIGS. 2A and 3, a portion, overlapped with the orthographic projection of the first protective layer 3 on the substrate 1, of the orthographic projection of the second protective layer 4 on the substrate 1 is a first overlapping portion 41, and the first overlapping portion 41 is located at the connection region C. A distance d3 between an end of the first overlapping portion 41 proximate to the body region A and an end of the first overlapping portion 41 away from the body region A is greater than or equal to 0.2 mm.

In this way, the second protective layer 4 may be lapped on the first protective layer 3, which is conducive to preventing the first conductive layer from being exposed due to a fact that the second protective layer falls off from the first protective layer caused by a small lapping size of the second protective layer. Thus, the second protective layer 4 is capable of better protecting the portion of the first conductive layer 2 that is close to the edge of the first protective layer 3 proximate to the first bonding region B, so that the wirings in the first conductive layer 2 are less likely to be corroded, which is conducive to prolonging the service life of the flexible printed circuit 100.

In some embodiments, as shown in FIGS. 2A, 2B and 3, a portion of the first conductive layer 2 located at the first bonding region B includes a plurality of conductive blocks 21. In this case, the flexible printed circuit 100 may further include a third protective layer 5. The third protective layer 5 includes a plurality of conductive protective films 51, and a conductive protective film 51 covers a conductive block 21.

The conductive protective film 51 covers the conductive block 21 to protect the conductive block 21, so as to prevent the conductive block 21 from being corroded. A material of the conductive protective film 51 may include nickel and gold.

In a case where the flexible printed circuit 100 includes the plurality of conductive protective films 51, and each conductive protective film 51 covers a conductive block 21, as shown in FIG. 3, the second protective layer 4 may further cover a partial region of the first bonding region B and a partial region of any conductive protective film 51.

The partial region of the first bonding region B covered by the second protective is layer 4 may be a portion of the first bonding region B uncovered by the conductive blocks 21, e.g., a portion of the first bonding region B corresponding to a region between any two adjacent conductive blocks 21.

The second protective layer 4 covers the partial portion of any conductive protective film 51, which may be that the second protective layer 4 covers a side of the conductive protective film 51 proximate to the connection region C, and a portion, close to the connection region C, of a surface of the conductive protective film 51 away from the substrate 1. In this way, the second protective layer 4 is further capable of well covering a portion (e.g., wiring(s) connected to the conductive block 21) of the first conductive layer 2 that is close to an edge of the conductive protective film 51 proximate to the connection region C, so as to better protect the first conductive layer 2. Thus, the first conductive layer 2 is less likely to be corroded, which is conducive to prolonging the service life of the flexible printed circuit 100.

For example, as shown in FIGS. 2A and 3, a portion, overlapped with an orthographic projection of the conductive protective film 51 on the substrate 1, of the orthographic projection of the second protective layer 4 on the substrate 1 is a second overlapping portion 42, and the second overlapping portion 42 is located at the first bonding region B. A distance d4 between an end of the second overlapping portion 42 proximate to the connection region C and an end of the second overlapping portion 42 away from the connection region C is greater than or equal to 0.2 mm.

In this way, the second protective layer 4 be completely lapped on each conductive protective film 51, and is not easy to fall off therefrom, which is conducive to protecting the portion (e.g., the wiring(s) connected to the conductive block 21) of the first conductive layer 2 that is close to the edge of the conductive protective film 51 proximate to the connection region C.

In some embodiments, the second protective layer 4 may include a green oil (i.e., liquid photoimagable solder mask) protective layer. That is, the second protective layer 4 may be made of green oil. The material of the second protective layer 4 is not limited thereto. For example, the second protective layer 4 may be made of photosensitive ink or solder resist ink.

In some embodiments, a thickness of the second protective layer 4 may be less than a thickness of the first protective layer 3, In this way, a thickness of the flexible printed circuit 100 at a region in the connection region C covered by the second protective layer 4 is less than a thickness of the flexible printed circuit 100 at the region in the connection region C covered by the first protective layer 3, so that the flexible printed circuit 100 has a small thickness and good flexibility at the region in the connection region covered by the second protective layer 4, which facilitates the bending of the flexible printed circuit 100. For example, the thickness of the second protective layer 4 may be in a range of 10 μm to 30 μm, inclusive, and the thickness of the first protective layer 3 may be 40 μm.

Figure 4A:
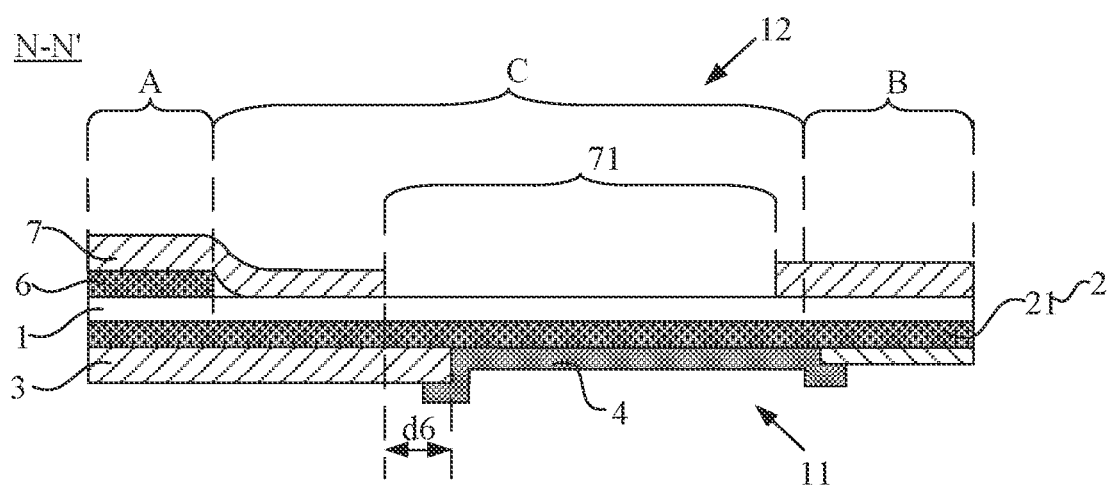
FIG. 4A is another sectional view of the flexible printed circuit at N-N', in accordance with some embodiments.
Figure 4B:
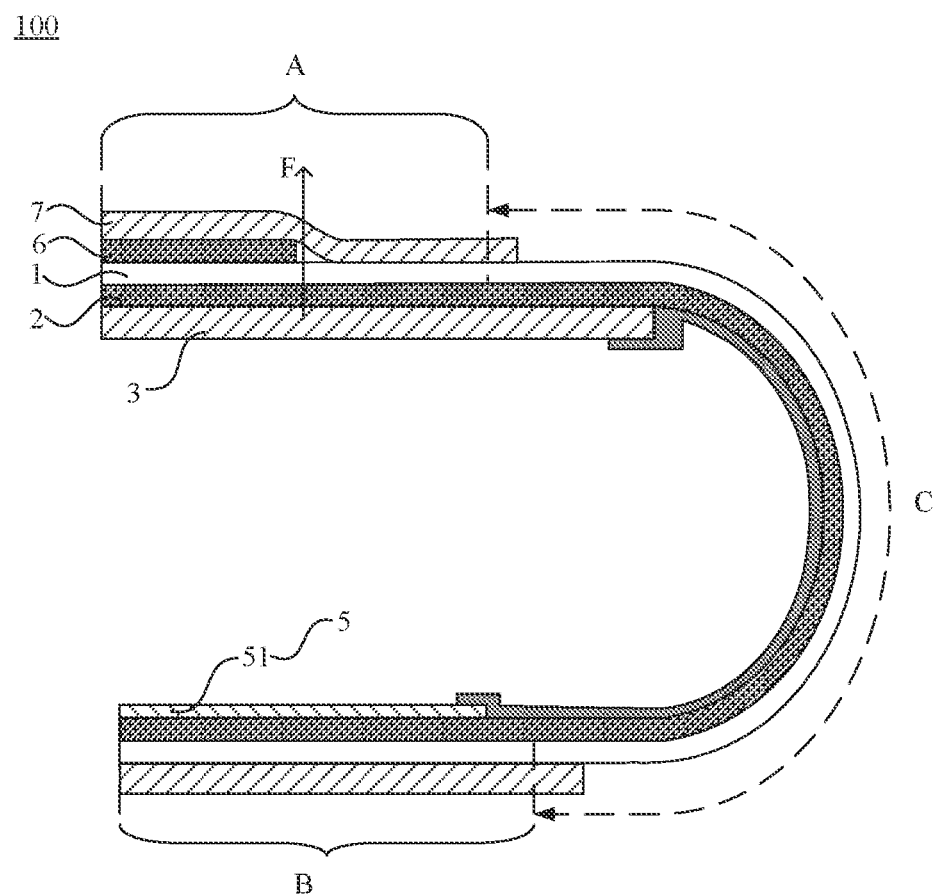
FIG. 4B is a structural diagram of another bent flexible printed circuit, in accordance with some embodiments.

In some embodiments, as shown in FIGS. 4A and 4B, the flexible printed circuit 100 further includes a second conductive layer 6 and a fourth protective layer 7. The second conductive layer 6 is located on a second side 12 of the substrate 1, and the second side 12 is a side of the substrate 1 that is opposite to the first side 11. The second conductive layer 6 covers the body region A. The fourth protective layer 7 is located on a side of the second conductive layer 6 away from the substrate 1, and extends from the body region A to the first bonding region B via the connection region C. At least one first opening 71 is provided in the fourth protective layer 7. Orthogonal projection(s) of the at least one first opening 71 on the substrate 1 are located in the connection region C.

In this way, on a basis of partially covering the connection region C by the first protective layer 3, the at least one first opening 71 is disposed at a position of the fourth protective layer 7 corresponding to the connection region C, so that the flexible printed circuit 100 has fewer film layers and a smaller thickness at a position corresponding to the first opening(s) 71, and thus, the flexible printed circuit has better flexibility at the position corresponding to the first opening(s). Therefore, when the first bonding region B in the flexible printed circuit 100 is bonded to the display panel, by bending the flexible printed circuit 100 at the position corresponding to the first opening(s) 71 (referring to FIG. 4B), a portion of the flexible printed circuit 100 located on a side of the first opening(s) 71 away from the first bonding region B may be easily bent to the back of the display panel, and the bounce force F in the direction perpendicular to the substrate 1 to which the flexible printed circuit 100 is subjected at the body region A may be reduced, which is conducive to avoiding the bouncing and the warping of the flexible printed circuit 100 after being bent.

In addition, since the flexible printed circuit 100 has good flexibility, in the display device having the flexible printed circuit 100, the flexible printed circuit 100 may be bent more to the back of the display panel of the display device, so that the space occupied by the flexible printed circuit 100 around the display panel is reduced, and thus, the bezel of the display device may be arranged to be narrow.

In addition, in the flexible printed circuit 100 provided in some embodiments of the present disclosure, the first protective layer 3 partially covers the connection region C, and the at least one first opening 71 is disposed at the position of the fourth protective layer 7 corresponding to the connection region C, so that a stress center line of the flexible printed circuit is shifted outward, which is conducive to preventing the stress center line from being overlapped with the first conductive layer or the first protective layer to reduce a tension on the first conductive layer 2, thereby reducing tearing and cracking risks of the flexible printed circuit.

It is worth pointing out that the fourth protective layer 7 extends from the body region A to the first bonding region B via the connection region C, i.e., the fourth protective layer 7 further covers the first bonding region B. This arrangement is further conducive to avoiding wrinkles at the first bonding region B due to a small thickness of the flexible printed circuit 100 at the first bonding region B. In a case where the plurality of conductive blocks 21 (for bonding the flexible printed circuit to a bonding region of the display panel) are disposed at the first bonding region B, this arrangement is further conducive to avoiding a bonding failure due to wrinkles of the conductive blocks 21.

Figure 5:
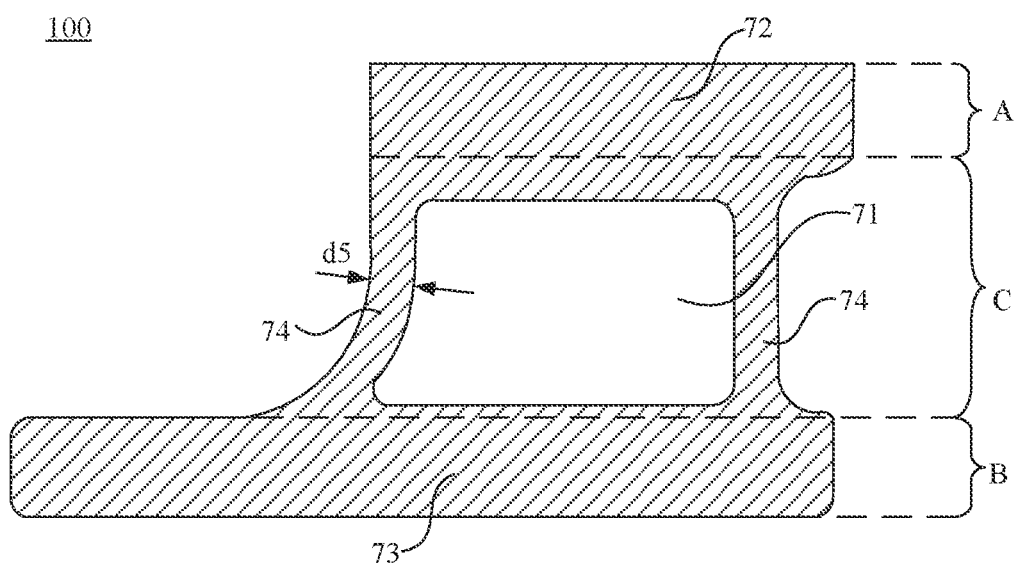
FIG. 5 is a partial top view of a flexible printed circuit, in accordance with some embodiments.

In some embodiments, as shown in FIG. 5, the fourth protective layer 7 may include a first portion 72, a second portion 73 and at least two rib-shaped structures 74. The first portion 72 covers at least the body region A. The second portion 73 covers at least the first bonding region B. Orthographic projections of the at least two rib-shaped structures 74 on the substrate 1 are located in the connection region C. Two opposite ends of each rib-shaped structure 74 are connected to the first portion 72 and the second portion 73, respectively. Any two adjacent rib-shaped structures 74, the first portion 72, and the second portion 73 enclose to form a first opening 71.

The first portion 72 covers at least the body region A, which may be that the first portion 72 covers only the body region A, or the first portion 72 covers not only the body region A, but also a portion of the connection region C (as shown in FIG. 5), Similarly, the second portion 73 covers at least the first bonding region B, which may be that the second portion 73 covers only the first bonding region B, or the second portion 73 covers not only the first bonding region B, but also a portion of the connection region C (as shown in FIG. 5).

In the flexible printed circuit provided in some embodiments of the present disclosure, the first portion 72, the second portion 73 and any two adjacent rib-shaped structures 74 enclose to form the first opening 71, so that an orthogonal projection of the first opening 71 on the substrate 1 is located within the connection region C, and the flexible printed circuit 100 has more film layers and a larger thickness at an edge of the connection region C, which is conducive to avoiding cracks at the edge of the connection region due to a small thickness of the flexible printed circuit at the connection region during the bending of the flexible printed circuit.

The fourth protective layer 7 includes the at least two rib-shaped structures 74. For example, the fourth protective layer 7 may include two rib-shaped structures 74 (as shown in FIG. 5). Alternatively, the fourth protective layer 7 may include three or more rib-shaped structures 74.

In some embodiments, as shown in FIG. 5, in a case where the fourth protective layer 7 includes two rib-shaped structures 74, the two rib-shaped structures 74 may respectively extend along two opposite sides of the connection region C. In this way, the two rib-shaped structures 74 respectively make the thicknesses of the flexible printed circuit 100 at the two opposite sides of the connection region C large, so that when the flexible printed circuit 100 is bent, cracks do not easily occur at the two opposite sides of the connection region C.

In some embodiments, as shown in FIG. 5, a width d5 of each rib-shaped structure 74 may be in a range of 0.2 mm to 1 mm, inclusive. In this way, on one hand, in a case where the width of the rib-shaped structure 74 is close to 0.2 mm, an area of a portion of the connection region C covered by the rib-shaped structure 74 is small, which is conducive to reducing an area of a portion of the flexible printed circuit 100 having a large thickness at the connection region C, so as to improve the flexibility of the flexible printed circuit 100 at the connection region C. On another hand, in a case where the width of the rib-shaped structure 74 is close to 1 mm, the flexible printed circuit 100 may have good flexibility the connection region C, and the flexible printed circuit 100 is less likely to be broken.

Figure 6:
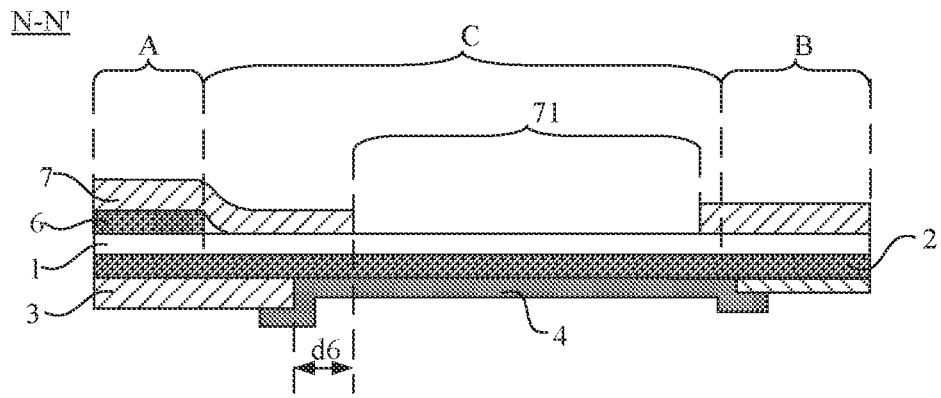
FIG. 6 is yet another sectional view of the flexible printed circuit at N-N', in accordance with some embodiments.

In some embodiments, as shown in FIGS. 4A and 6, a distance d6 from any point on a border, proximate to the first bonding region B, of the orthographic projection of the first protective layer 3 on the substrate 1 to the orthogonal projection of the first opening 71 on the substrate 1 is greater than or equal to 0.5 mm. That is, the distance d6 from the border, proximate to the first bonding region B, of the orthographic projection of the first protective layer 3 on the substrate 1 to a border, proximate to the body region A, of the orthogonal projection of the first opening 71 on the substrate 1 is greater than or equal to 0.5 mm.

It will be noted that only a distance relationship between the border, proximate to the first bonding region B, of the orthographic projection of the first protective layer 3 on the substrate 1 and the border, proximate to the body region A, of the orthogonal projection of the first opening 71 on the substrate 1 is limited, and a relative position between the border, proximate to the first bonding region B, of the orthographic projection of the first protective layer 3 on the substrate 1 and the border, proximate to the body region A, of the orthogonal projection of the first opening 71 on the substrate 1 is not limited. For example, as shown in FIG. 4A, compared with the border, proximate to the body region A, of the orthogonal projection of the first opening 71 on the substrate 1, the border, proximate to the first bonding region B, of the orthographic projection of the first protective layer 3 on the substrate 1 is farther from the body region A. For another example, as shown in FIG. 6, compared with the border, proximate to the body region A, of the orthogonal projection of the first opening 71 on the substrate 1, the border, proximate to the first bonding region B, of the orthographic projection of the first protective layer 3 on the substrate 1 is closer to the body region A.

The distance d6 between the border, proximate to the first bonding region B, of the orthographic projection of the first protective layer 3 on the substrate 1 and the orthogonal projection of the first opening 71 on the substrate 1 is greater than or equal to 0.5 mm, so that stress concentration in the flexible printed circuit 100 may be prevented from occurring at a border of the first opening 71 proximate to the body region A or at a border of the first protective layer 3 located at the connection region C.

Figure 7:
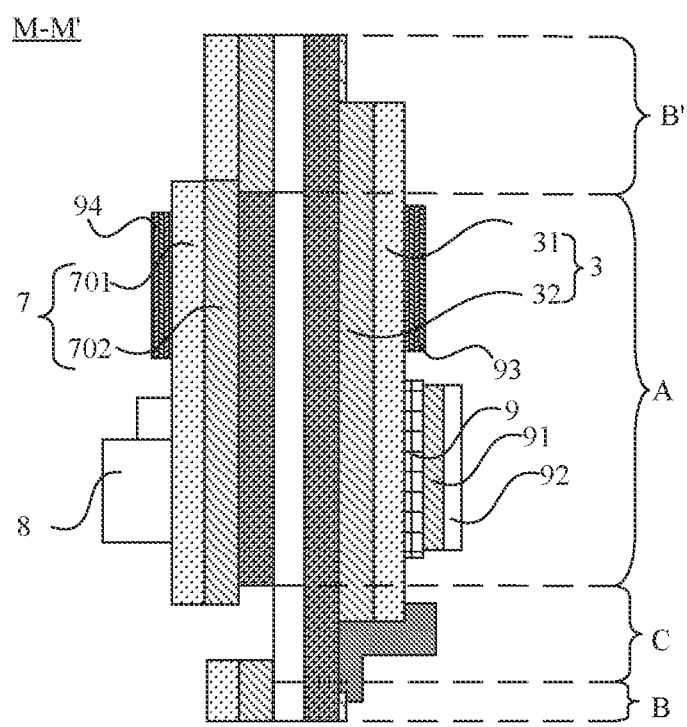
FIG. 7 is a sectional view of the flexible printed circuit at M-M' in FIG. 1, in accordance with some embodiments.

In some embodiments, as shown in FIG. 7, the first protective layer 3 may include a first insulating layer 31 and a first adhesive layer 32. The first adhesive layer 32 is closer to the first conductive layer 2 than the first insulating layer 31. For example, the first insulating layer 31 may be made of polyimide or polyethylene terephthalate (PET). The first adhesive layer 32 may be made of double-sided adhesive.

In some embodiments, as shown in FIG. 7, the fourth protective layer 7 includes a second insulating layer 701 and a second adhesive layer 702, The second adhesive layer 702 is closer to the second conductive layer 6 than the second insulating layer 701. For example, the second insulating layer 701 may be made of polyimide or polyethylene terephthalate. The second adhesive layer 702 may be made of double-sided adhesive.

In some embodiments, as shown in FIG. 7, the flexible printed circuit 100 further includes an integrated chip 8 and a reinforcement layer 9. The integrated chip 8 is located on a side of the fourth protective layer 7 away from the substrate 1. An orthographic projection of the integrated chip 8 on the substrate 1 is located in the body region A. The integrated chip 8 passes through the fourth protective layer 7 to be electrically connected to the second conductive layer 6. The reinforcement layer 9 is located on a side of the first protective layer 3 away from the substrate 1. An orthographic projection of the reinforcement layer 9 on the substrate 1 is overlapped with or partially overlapped with the orthographic projection of the integrated chip 8 on the substrate 1.

The reinforcement layer 9 may include a stainless steel layer.

The reinforcement layer 9 is arranged opposite to the integrated chip 8, so as to enhance a supporting capability of the flexible printed circuit 100 for devices (e.g., the integrated chip), thereby avoiding bending deformation of the flexible printed circuit 100 at the body region A due to an overweight of the devices, which is conducive to improving the stability of the flexible printed circuit 100. In addition, the reinforcement layer 9 is further capable of avoiding cold solder joints.

For example, as shown in FIG. 7, the flexible printed circuit 100 may further include a third adhesive layer 91 located on a side of the reinforcement layer 9 away from the substrate 1, The third adhesive layer 91 enables the portion of the flexible printed circuit 100 that is bent to the back of the display panel to be adhered to the back of the display panel, which is conducive to avoiding the bouncing and the warping of the portion of the flexible printed circuit that is bent to the back of the display panel.

For example, as shown in FIG. 7, the flexible printed circuit 100 may further include a release film 92 disposed on a side of the third adhesive layer 91 away from the reinforcement layer 9.

For example, as shown in FIG. 7, the flexible printed circuit 100 may further include a first electromagnetic shielding film 93 disposed on the side of the first protective layer 3 away from the substrate 1, and a second electromagnetic shielding film 94 disposed on the side of the fourth protective layer 7 away from the substrate 1. The second electromagnetic shielding film 94 does not cover the integrated chip 8.

In some embodiments, as shown in FIG. 7, the substrate 1 further has a second bonding region B' located on a side of the body region A away from the connection region C. The first conductive layer 2 may further extend from the body region A to the second bonding region B'. A portion of the first conductive layer 2 corresponding to the second bonding region B' may also have a plurality of conductive blocks 21, and each conductive block 21 is covered by a conductive protective film 51. The first protective layer 3 extends from the body region A to the second bonding region ET, and the first protective layer 3 only partially covers the second bonding region B. The fourth protective layer 7 may extend from the body region A to the second bonding region B', and may cover the second bonding region B' completely. The second bonding region B' of the flexible printed circuit 100 may be bonded to the control circuit board.

Figure 8:
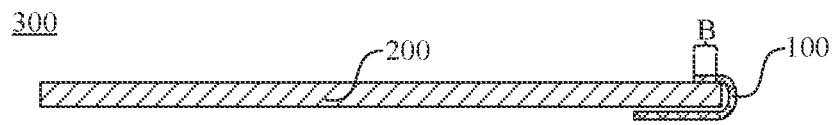
FIG. 8 is a structural diagram of a display device. In accordance with some embodiments.

Some embodiments of the present disclosure further provide a display device 300. As shown in FIG. 8, the display device 300 includes a display panel 200 and the flexible printed circuit 100 in any one of the above embodiments. The first bonding region B in the flexible printed circuit 100 is bonded to the display panel 200.

For example, the display panel 200 may be an organic light-emitting diode (OLED) display panel.

The display device 300 may be any component with a display function, such as a television, a digital camera, a mobile phone, a watch, a tablet computer, a notebook computer, or a navigator. Beneficial effects that may be achieved by the display device 300 are the same as the beneficial effects that may be achieved by the flexible printed circuit 100 in the above technical solutions, and will not be repeated here.

Figure 9:
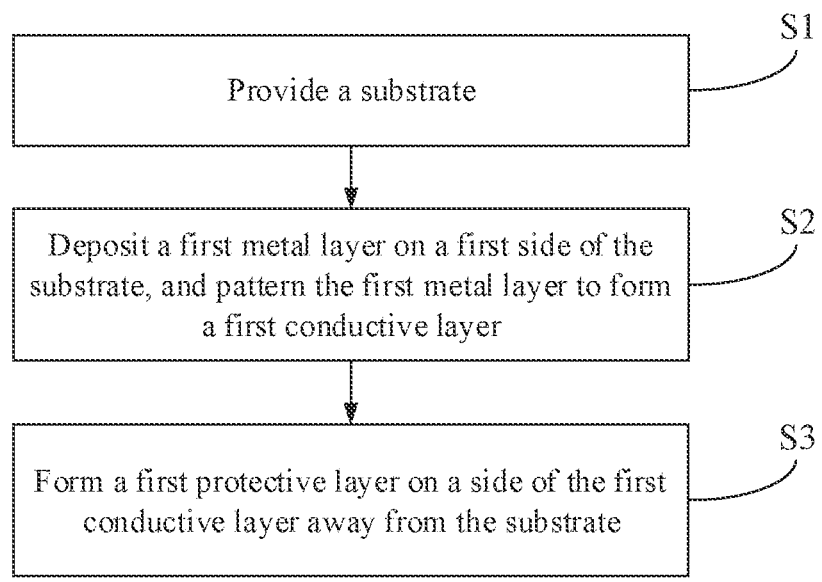
FIG. 9 is a flow diagram of a manufacturing method of a flexible printed circuit, in accordance with some embodiments.

Some embodiments of the present disclosure further provide a manufacturing method of a flexible printed circuit 100. As shown in FIG. 9, the manufacturing method includes following steps.

In S1, a substrate 1 is provided. The substrate 1 has a body region A, a first bonding region B, and a connection region C located between the body region A and the first bonding region B.

In S2, a first metal layer is deposited on a first side 11 of the substrate 1, and the first metal layer is patterned to form a first conductive layer 2. The first conductive layer 2 extends from the body region A to the first bonding region B via the connection region C.

In S3, a first protective layer 3 is formed on a side of the first conductive layer 2 away from the substrate 1. The first protective layer 3 extends from the body region A to the connection region C, and the first protective layer 3 partially covers the connection region C.

The flexible printed circuit 100, manufactured by using the manufacturing method of the flexible printed circuit 100 provided in some embodiments of the present disclosure, has fewer film layers and a smaller thickness at a position corresponding to the connection region C and uncovered by the first protective layer 3, so that the flexible printed circuit 100 has good flexibility at the position corresponding to the connection region C. Therefore, by bending the flexible printed circuit 100 at the position corresponding to the connection region C, a portion of the flexible printed circuit 100 located on a side of the connection region C away from the first bonding region B may be easily bent to a back of a display panel. Moreover, when the flexible printed circuit 100 is bent to the back of the display panel, a bounce force F in a direction perpendicular to the substrate 1 to which the flexible printed circuit 100 is subjected at the body region A may be reduced, which is conducive to avoiding bouncing and warping of the flexible printed circuit 100 after being bent.

In addition, since the flexible printed circuit 100 has good flexibility, in a display device having the flexible printed circuit 100, the flexible printed circuit may be bent more to a back of a display panel of the display device, so that a space occupied by the flexible printed circuit around the display panel is reduced, and thus, a bezel of the display device may be arranged to be narrow.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A flexible printed circuit, comprising:
    a substrate having a body region, a first bonding region, and a connection region located between the body region and the first bonding region, wherein the body region includes a component mounting region;
    a first conductive layer located on a first side of the substrate and extending from the body region to the first bonding region via the connection region;
    a first protective layer located on a side of the first conductive layer away from the substrate and extending from the body region to the connection region; wherein the first protective layer partially covers the connection region, and the first protective layer does not cover the first bonding region;
    a second conductive layer located on a second side of the substrate; wherein the second side is a side of the substrate that is opposite to the first side; the second conductive layer covers the body region; and
    a fourth protective layer located on a side of the second conductive layer away from the substrate and extending from the body region to the first bonding region via the connection region; wherein at least one first opening is disposed in the fourth protective layer, and an orthogonal projection of the at least one first opening on the substrate is located in the connection region;
    wherein the fourth protective layer includes:
        a first portion covering at least the body region;
        a second portion covering at least the first bonding region; and
        at least two rib-shaped structures; wherein orthographic projections of the at least two rib-shaped structures on the substrate are located in the connection region, and two opposite ends of each rib-shaped structure are respectively connected to the first portion and the second portion; and any two adjacent rib-shaped structures, the first portion and the second portion enclose to form a first opening in the at least one first opening.

2. The flexible printed circuit according to claim 1, wherein the connection region includes a first region and a second region connected to each other, and the first region is closer to the body region than the second region; the first region is further connected to the body region, and the second region is further connected to the first bonding region; and
    the first protective layer covers the first region, and does not cover the second region.

3. The flexible printed circuit according to claim 1, wherein
    an area of a region in the connection region covered by the first protective layer is less than an area of a region in the connection region uncovered by the first protective layer.

4. The flexible printed circuit according to claim 1, further comprising:
    a second protective layer located on the side of the first conductive layer away from the substrate and covering at least a region in the connection region uncovered by the first protective layer.

5. The flexible printed circuit according to claim 1, wherein the at least two rib-shaped structures include two rib-shaped structures respectively extending along two opposite sides of the connection region.

6. The flexible printed circuit according to claim 1, wherein a width of each rib-shaped structure is in a range of 0.2 mm to 1 mm, inclusive.

7. The flexible printed circuit according to claim 1, wherein
a distance from any point on a border, proximate to the first bonding region, of an orthographic projection of the first protective layer on the substrate to the orthogonal projection of the first opening on the substrate is greater than or equal to 0.5 mm.

8. A display device, comprising:
a display panel; and
the flexible printed circuit according to claim 1; wherein
the first bonding region in the flexible printed circuit is bonded to the display panel.

9. The flexible printed circuit according to claim 2, wherein a distance from any position on a dividing line between the first region and the second region to the body region is less than a distance from this position to the first bonding region.

10. The flexible printed circuit according to claim 4, wherein
the second protective layer further partially covers the first protective layer.

11. The flexible printed circuit according to claim 4, wherein
a portion of the first conductive layer located at the first bonding region includes a plurality of conductive blocks;
the flexible printed circuit further comprises a third protective layer including a plurality of conductive protective films, and a conductive protective film in the plurality of conductive protective films covers a conductive block in the plurality of conductive blocks; and
the second protective layer further covers a partial region of the first bonding region and a partial region of any conductive protective film.

12. The flexible printed circuit according to claim 4, wherein
the second protective layer includes a green oil protective layer.

13. The flexible printed circuit according to claim 4, wherein
a thickness of the second protective layer is less than a thickness of the first protective layer.

14. The flexible printed circuit according to claim 9, wherein the distance from any position on the dividing line between the first region and the second region to the body region is greater than or equal to 0.5 mm.

15. The flexible printed circuit according to claim 10, wherein
a portion, overlapped with an orthographic projection of the first protective layer on the substrate, of an orthographic projection of the second protective layer on the substrate is a first overlapping portion, and the first overlapping portion is located at the connection region; and a distance between an end of the first overlapping portion proximate to the body region and an end of the first overlapping portion away from the body region is greater than or equal to 0.2 mm.

16. The flexible printed circuit according to claim 11, wherein
a portion, overlapped with an orthographic projection of the any conductive protective film on the substrate, of an orthographic projection of the second protective layer on the substrate is a second overlapping portion, and the second overlapping portion is located at the first bonding region; and a distance between an end of the second overlapping portion proximate to the connection region and an end of the second overlapping portion away from the connection region is greater than or equal to 0.2 mm.

17. A flexible printed circuit, comprising:
a substrate having a body region, a first bonding region, and a connection region located between the body region and the first bonding region, wherein the body region includes a component mounting region;
a first conductive layer located on a first side of the substrate and extending from the body region to the first bonding region via the connection region;
a first protective layer located on a side of the first conductive layer away from the substrate and extending from the body region to the connection region; wherein the first protective layer partially covers the connection region, and the first protective layer does not cover the first bonding region;
a second conductive layer located on a second side of the substrate; wherein the second side is a side of the substrate that is opposite to the first side; the second conductive layer covers the body region; and
a fourth protective layer located on a side of the second conductive layer away from the substrate and extending from the body region to the first bonding region via the connection region; wherein at least one first opening is disposed in the fourth protective layer, and an orthogonal projection of the at least one first opening on the substrate is located in the connection region; wherein
the first protective layer includes a first insulating layer and a first adhesive layer, and the first adhesive layer is closer to the first conductive layer than the first insulating layer; and/or
the fourth protective layer includes a second insulating layer and a second adhesive layer, and the second adhesive layer is closer to the second conductive layer than the second insulating layer.

18. A flexible printed circuit, comprising:
a substrate having a body region, a first bonding region, and a connection region located between the body region and the first bonding region, wherein the body region includes a component mounting region;
a first conductive layer located on a first side of the substrate and extending from the body region to the first bonding region via the connection region;
a first protective layer located on a side of the first conductive layer away from the substrate and extending from the body region to the connection region; wherein the first protective layer partially covers the connection region, and the first protective layer does not cover the first bonding region;
a second conductive layer located on a second side of the substrate; wherein the second side is a side of the substrate that is opposite to the first side; the second conductive layer covers the body region;
a fourth protective layer located on a side of the second conductive layer away from the substrate and extending from the body region to the first bonding region via the connection region; wherein at least one first opening is disposed in the fourth protective layer, and an orthogonal projection of the at least one first opening on the substrate is located in the connection region;
an integrated chip located on a side of the fourth protective layer away from the substrate; wherein an orthographic projection of the integrated chip on the substrate is located in the body region, and the integrated chip passes through the fourth protective layer to be electrically connected to the second conductive layer; and a reinforcement layer located on a side of the first protective layer away from the substrate; wherein an orthographic projection of the reinforcement layer on the substrate is overlapped with or partially overlapped with the orthographic projection of the integrated chip on the substrate.

* * * * *